United States Patent
Ishibashi et al.

(10) Patent No.: US 7,397,830 B2
(45) Date of Patent: Jul. 8, 2008

(54) SEMICONDUCTOR LASER DEVICE

(75) Inventors: Kenzo Ishibashi, Osaka (JP); Katsumi Gotoh, Osaka (JP); Takatoshi Yukimasa, Osaka (JP); Makoto Ichinose, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 155 days.

(21) Appl. No.: 10/555,940

(22) PCT Filed: Feb. 20, 2004

(86) PCT No.: PCT/JP2004/002035

§ 371 (c)(1),
(2), (4) Date: Mar. 8, 2006

(87) PCT Pub. No.: WO2004/100168

PCT Pub. Date: Nov. 18, 2004

(65) Prior Publication Data

US 2006/0285475 A1 Dec. 21, 2006

(51) Int. Cl.
*H01S 3/04* (2006.01)
(52) U.S. Cl. .......................... 372/34; 372/36
(58) Field of Classification Search ................ 372/36, 372/34
See application file for complete search history.

(56) References Cited

U.S. PATENT DOCUMENTS

| 4,617,870 A | * | 10/1986 | Hirano et al. ............... 110/323 |
| 6,856,475 B2 | * | 2/2005 | Nasu et al. .................. 359/820 |
| 7,046,281 B1 | * | 5/2006 | Kumagai et al. ....... 348/231.99 |
| 2002/0141161 A1 | * | 10/2002 | Matsukura et al. .......... 361/713 |
| 2004/0023614 A1 | * | 2/2004 | Koplin ....................... 454/184 |

FOREIGN PATENT DOCUMENTS

| JP | 4-32300 A | 2/1992 |
| JP | 05-157619 | * 6/1993 |
| JP | 11-112923 | 4/1999 |
| JP | 2001-338460 | 12/2001 |
| JP | 2002-15561 A | 1/2002 |
| JP | 2002-247500 A | 8/2002 |

OTHER PUBLICATIONS

International Search Report for PCT/JP2004/002035, dated Jul. 20, 2004.

* cited by examiner

*Primary Examiner*—Armando Rodriguez
(74) *Attorney, Agent, or Firm*—RatnerPrestia

(57) ABSTRACT

A semiconductor laser device according to the present invention includes a mechanism section having a semiconductor laser, a first frame for holding the mechanism section and radiating heat generated in the mechanism section, a control section for controlling the mechanism section, a second frame for holding the control section and radiating heat generated in the control section, and a coupling section for insulatively coupling the first frame to the second frame.

17 Claims, 6 Drawing Sheets

FIG.2

| | Case dimensions W×H×D [mm] | Radiating conditions | Consumed power [W] | Rise in temperature of case [°C or K] | Convection & Radiation [W] | Radiation [W] |
|---|---|---|---|---|---|---|
| (A) Case for mechanism section | 20×60×60 | Heat insulation on one broad side surface | 0.5 | 12.5 | 0.181 | 0.319 |
| (B) Open case for mechanism section | 20×60×60 | Open | 0.5 | 9.0 | 0.173 | 0.327 |
| (C) Case for circuit section | 20×60×60 | Heat insulation on one broad side surface | 1.5 | 33.1 | 0.611 | 0.889 |
| (D) Open case for circuit section | 20×60×60 | Open | 1.5 | 24.1 | 0.591 | 0.909 |
| (E) Accommodate mechanism section and circuit section in one case | 40×60×60 | Open | 2.0 | 23.1 | 0.784 | 1.216 |
| (F) Accommodate mechanism section in one case | 40×60×60 | Open | 0.5 | 6.6 | 0.165 | 0.335 |
| (G) Accommodate circuit section in one case | 40×60×60 | Open | 1.5 | 17.9 | 0.570 | 0.930 |

SEMICONDUCTOR LASER DEVICE

This Application is a U.S. National Phase Application of PCT International Application PCT/JP2004/002035.

TECHNICAL FIELD

The present invention relates to a semiconductor laser device and more particularly to a semiconductor laser device in which a frame for radiating heat generated in a mechanism section including a semiconductor laser and a frame for radiating heat generated in a control section for controlling the mechanism section are insulatively coupled to each other.

BACKGROUND ART

In recent years, a technique has been developed for achieving higher data storage density in a phase transition type optical disk, using a blue semiconductor laser and utilizing an objective lens having a high NA of 0.85.

When using the aforementioned technique, even if the diameter of the optical disk is small, for example approximately 5 cm, the capacity of the optical disk is 3 to 4 GB so that an optical disk having a large capacity can be implemented.

By applying a compressing technique such as MPEG2 to the optical disk, it is possible to implement a genuine optical disk video camera which can perform photographing with equivalent picture quality for an equivalent time to those of a conventional tape.

In the optical disk video camera, random access can be given to an optical disk. In contrast to a video camera using a conventional tape, therefore, rewinding is not required so that a user does not need to wait for a rewind operation. Moreover, in the optical disk video camera, a user can immediately reproduce the video intended to be viewed by selecting a thumbnail video. Moreover, the optical disk video camera can store a static image subjected to a JPEG compression on the same optical disk. Therefore, in the above-described optical disk video camera, the camera is expected to be of greater practical use to the user, and more comfortable and convenient.

In a semiconductor laser to be used in an optical disk device such as an optical disk video camera, however, the amount of heat generation per unit volume is generally larger than that in other integrated circuits (IC) and electronic components.

On the other hand, the upper limit of an operation guarantee temperature at which the operation of the semiconductor laser is guaranteed is low, that is, between 60 and 70° C. Furthermore, even if an operating temperature for operating the semiconductor laser ranges within the operation guarantee temperature, the lifetime of the semiconductor laser tends to be shorter when the operating temperature is raised.

Accordingly, a reduction in the consumed power of the optical disk device or an improvement in the radiating mechanism of the optical disk device is greatly desirable, in order to reduce the operating temperature of the semiconductor laser to be mounted on the optical head.

For this purpose, conventionally, there have been various proposals, mainly for a semiconductor laser and peripheral components thereof in relation to the optical disk device. In order to suppress a rise in the operating temperature of the semiconductor laser, basically, it is possible to suggest two approaches. One approach is, a reduction in a consumed power and another is an improvement in a radiating mechanism.

A description will be given of three examples related to improvement in the radiating mechanism.

As an example, Japanese Laid-Open Patent Publication No. 11-112923 has described a configuration in which an optical disk device is surrounded by a frame member capable of easily radiating heat. The device and the frame member are fixed to a frame having a radiating fin and are incorporated in a camera to improve the ability of the optical disk device to radiate heat. The frame member is formed by an elastic material and also serves to protect the optical disk device from vibration.

As another example, Japanese Laid-Open Patent Publication No. 2001-338460 has described a configuration in which heat generated in a semiconductor laser mounted on an optical head is transferred outside of the laser and eliminated by a Peltier element and a cooling fan in order to cool the semiconductor laser. With this configuration, a mechanism section mounting the optical head and a circuit board (a circuit section) are separated from each other and a heat insulating member is disposed between the mechanism section and the circuit board. An effect of providing the heat insulating member is that heat generated in the circuit section is prevented from being transferred to the mechanism section.

As a further example, Japanese Laid-Open Patent Publication No. 2002-15561 has described a configuration in which a radiating plate having a high thermal conductivity is disposed between a mechanism section and a circuit section in an optical disk device. An air layer is formed between the mechanism section and the radiating section in order to improve the radiation ability of the optical disk device. An effect of providing this configuration is that heat generated in the circuit section is not transferred to the mechanism section, but is radiated from the radiating plate, and the temperature of the mechanism section provided with a semiconductor laser is prevented from being raised.

In the case in which the size of the optical disk device is reduced and the size of a video camera incorporating the optical disk device is also reduced, i.e. when manufacturing a small-sized portable video camera or a mobile video camera, all of the aforementioned three examples have the following problems.

In the configuration described in Japanese Laid-Open Patent Publication No. 11-112923, the frame member surrounds the optical disk device. Therefore, the size of the frame member becomes comparatively large.

The Peltier element described in Japanese Laid-Open Patent Publication No. 2001-338460 has a comparatively large power consumption for cooling. Furthermore, an opposite surface to a cooling surface generates heat corresponding to an amount of power consumed by the Peltier element. In addition, the cooling fan also consumes power. Accordingly, taking these factors into account when considering a small-sized portable video camera, a rise in the temperature of the whole video camera is increased. When the Peltier element and the cooling fan are driven for cooling, the duration of a battery used in the camera is reduced due to the increase in power consumption.

In Japanese Laid-Open Patent Publication No. 2001-338460, it can be assumed that the insulating material disposed between the mechanism section and the circuit section is effective because it does not directly transfer the heat generated in the circuit section to the mechanism section.

With this configuration, however, the air in the vicinity of the mechanism section in the optical disk device is exchanged with the air in the vicinity of the circuit section. In this configuration, moreover, the mechanism section and the circuit section are thermally coupled to each other by means of a top cover and a bottom cover which enclose the whole optical disk device.

Accordingly, in the optical disk device, it can be assumed that the transfer of the heat generated in the circuit section, to the mechanism section is temporarily blocked by the insulating member. Also it can be assumed that the temperatures of two covers enclosing the mechanism section and the circuit section are almost equal to each other by the exchange of the air and the thermal coupling of the mechanism section and the circuit section in the case where the optical disk device is used for a long time.

Accordingly, in Japanese Laid-Open Patent Publication No. 2001-338460, it can be predicted that a time required for the saturation of the temperature is prolonged and a saturation temperature is not changed depending on the presence of the insulating member. In other words, in respect of the suppression of a rise in temperature around the semiconductor laser, it can be assumed that the insulating material disclosed in Japanese Laid-Open Patent Publication No. 2001-338460 is effective when the optical disk device is used for a short time and is less effective when the optical disk device is used for a long time.

Moreover, it can be assumed that a great radiating effect can be obtained in the case in which the radiating plate having a high thermal conductivity is disposed between the mechanism section and the circuit section and is directly attached to the case of a personal computer as in Japanese Laid-Open Patent Publication No. 2002-15561. However, the mechanism section and the circuit section are thermally coupled to each other through the radiating plate. A situation might occur in which the amount of heat generation of the mechanism section is smaller than that of the circuit section, and a rise in the temperature of the mechanism section is smaller than a rise in the temperature of the circuit section. As a result of this, the heat generated in the circuit section is transferred to the mechanism section so that the temperature of the mechanism section is raised.

As described above, a conventional radiating mechanism has the effect of preventing a rise in the temperature of the semiconductor laser. However, such a radiating mechanism is not very suitable for small-sized portable equipment or mobile equipment.

In the case in which a blue semiconductor laser is used in the optical disk device and the size of the optical disk device is reduced, the problem of the rise in the temperature becomes even more serious.

As compared with a red semiconductor laser, the blue semiconductor laser, in principle, has a higher forward voltage in operation and an operating current of the blue semiconductor laser is also larger under the existing circumstances. As a result, the amount of heat generation is very large. Accordingly, the blue semiconductor laser itself operates at temperature higher than the temperature of the red semiconductor laser.

In addition to this, the size of the optical disk video camera is set to be equivalent to that of a video camera using a tape. When the size of the optical disk device is reduced, therefore, the surface area of the optical disk device is decreased.

In general, the radiating capability of the optical disk device is almost proportional to the surface area thereof When the surface area of the optical disk device is decreased, the radiating capability of the optical disk device is necessarily reduced. When the consumed power of the optical disk device is set to be constant, accordingly, a rise in temperature in the optical disk device is more increased.

In order to lower the temperature of the blue semiconductor laser to have the same level as the level of the temperature of the red semiconductor laser in such a situation, it is necessary to suppress the rise in the temperature in the optical disk device to a great extent than in the case in which the red semiconductor laser is used. This is one of great problems for a reduction in the size and shape of the optical disk device.

In order to solve the problems described above, it is an objective of the present invention to provide a semiconductor laser device in which rise in temperature therein can be effectively contained.

DISCLOSURE OF THE INVENTION

In order to attain the aforementioned objective, the present invention provides a semiconductor laser device including a mechanism section including a semiconductor laser, a first frame for holding the mechanism section and radiating heat generated in the mechanism section, a control section for controlling the mechanism section, a second frame for holding the control section and radiating the heat generated in the control section, and a coupling section for insulatively coupling the first frame to the second frame.

In the semiconductor laser device according to the present invention, the frame for radiating the heat generated in the mechanism section including the semiconductor laser and the frame for radiating heat generated in the control section for controlling the mechanism section are insulatively coupled to each other. Accordingly, the heat generated in the control section is not substantially transferred to the mechanism section. Therefore, it is possible to prevent the temperature of the semiconductor laser included in the mechanism section from being raised. Such a semiconductor laser device is suitable for mounting on peripheral equipment of a personal computer or the like or a video camera, and can enhance the operating reliability of the semiconductor laser and can prolong the lifetime of the semiconductor laser.

Moreover, it is also possible to further include a wiring section for electrically connecting the mechanism section to the control section.

Furthermore, the first frame may have a portion coming in contact with air and heat generated in the mechanism section may be radiated through the portion.

In addition, the second frame may have a portion coming in contact with air and heat generated in the control section may be radiated through the portion.

Moreover, the mechanism section may include an optical head for performing at least one of recording and reproduction for an optical disk, the optical head having the semiconductor laser.

Furthermore, the first frame and the second frame may be configured to prevent air in the first frame and air in the second frame from being convected.

In addition, at least one of the first frame and the second frame may contain a high thermal conducting material. Consequently, it is possible to increase the radiation efficiency of the frame.

Moreover, at least a part of a portion is subjected to surface finishing having a low radiation efficiency, the portion at which the first frame and the second frame facing each other. Consequently, the transfer of the heat from the control section to the mechanism section by radiation can be prevented more effectively. Consequently, it is possible to suppress a rise in the temperature of the semiconductor laser.

Furthermore, the first frame may have a first portion coming in contact with air, the second frame may have a second portion coming in contact with the air, and at least one of the first portion and the second portion may be subjected to surface finishing having a high radiation efficiency. Consequently, the radiation efficiency by the radiation from the frame to the air is increased. Thus, it is possible to suppress a rise in the temperature of the mechanism section or a rise in the temperature of the control section.

In addition, the wiring section may be sealed to prevent air in the first frame and the air in the second frame from being circulated mutually. Consequently, it is possible to efficiently prevent the heat generated in the control section from being transferred to the mechanism section by an air flow.

Moreover, the first frame may have a portion coming in contact with air, and the portion may be configured to cover a part of the second frame. Consequently, the radiation of the mechanism section can be promoted to a great extent so that a rise in the temperature of the semiconductor laser can be suppressed.

Furthermore, the first frame and the second frame may be disposed to provide a gap to allow air to circulate between the first frame and the second frame. Consequently, the radiation from the two frames can be promoted by the circulation of the air. Thus, the radiating effect can be enhanced to a greater extent.

In addition, the coupling section may contain a material having a low thermal conductivity. Consequently, the transfer of the heat generated in the control section to the mechanism section can be prevented more effectively. Thus, it is possible to suppress the rise in the temperature of the semiconductor laser.

Moreover, it is also possible for the semiconductor laser device to further include a heat insulating section disposed between the first frame and the second frame and formed with a material having a low thermal conductivity. The transfer of the heat generated in the control section to the mechanism section can be prevented more effectively. Therefore, it is possible to suppress the rise in the temperature of the semiconductor laser.

Furthermore, a gap may be present between at least one of the heat insulating section and the first frame and the heat insulating section and the second frame, and the gap may be configured to circulate air. Consequently, the radiation of the frame can be promoted to a great extent so that the rise in the temperature of the semiconductor laser can be suppressed.

In addition, the first frame may have a first portion coming in contact with air, the second frame have a second portion coming in contact with the air, and at least one of the first portion and the second portion is provided with a concavo-convex portion. Consequently, the radiation of the frame can be promoted to a great extent so that the rise in the temperature of the semiconductor laser can be suppressed.

Moreover, an upper limit value of an operating ambient temperature of the control section may be set to be greater than that of an operating ambient temperature of the semiconductor laser. Consequently, the rise in the temperature of the mechanism section can be reduced, and furthermore, the operations of circuit components in the control section can be guaranteed.

Furthermore, it is also possible to further include a camera section, a display section for displaying a video indicated by a video signal obtained by the camera section, and a video processing circuit for compressing the video signal and recording the compressed video signal as video information on the optical disk by using the optical head or reproducing the video information recorded on the optical disk by using the optical head, thereby expanding the video information thus reproduced and causing the display section to display the video information thus expanded. Consequently, it is possible to provide a semiconductor laser device which efficiently radiates heat generated in the mechanism section to suppress a rise in the temperature of a semiconductor laser and has a video camera function with a high reliability and a long lifetime.

BRIEF DESCRIPTION OF THE DRAWINGS

FIG. 2 is a table showing the result of a calculation for a rise in an inner temperature based on a case dimension and a consumed power.

BEST MODE FOR CARRYING OUT THE INVENTION

Embodiments of the present invention will be described below with reference to the drawings.

In the following description, an optical disk device will be explained as a specific example of a semiconductor laser device. The semiconductor laser device according to the present invention is not restricted to the optical disk device. The present invention can be applied to an optical semiconductor laser device if a frame for radiating heat generated in a mechanism section including a semiconductor laser and a frame for radiating heat generated in a control section for controlling the mechanism section are insulatively coupled to each other.

First Embodiment

Figure 1:
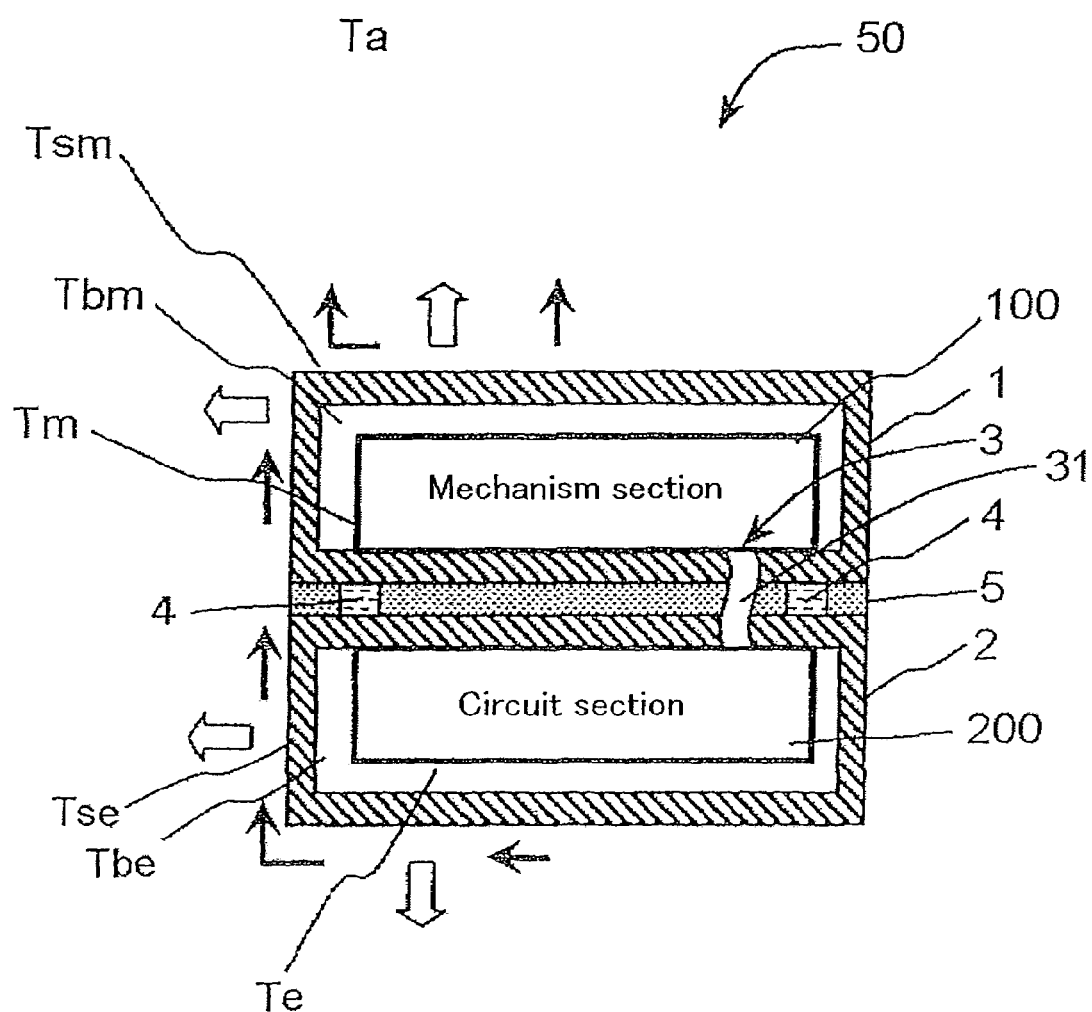
FIG. 1 is a sectional-view schematically showing an optical disk device according to a first embodiment of the present invention.

FIG. 1 is a sectional-view schematically showing an optical disk device 50 according to a first embodiment of the present invention.

The optical disk device 50 includes a mechanism section 100 including a semiconductor laser, a frame 1 for holding the mechanism section 100 and radiating heat generated in the mechanism section 100, a circuit section 200 for controlling the mechanism section 100, a frame 2 for holding the circuit section 200 and radiating heat generated in the circuit section 200, and a coupling section 4 for insulatively coupling the frame 1 to the frame 2.

The mechanism section 100 includes an optical head for performing at least one of recording and reproduction for an optical disk which is mounted. The details of the optical head will be described below with reference to FIG. 3.

The mechanism section 100 is attached to the frame 1 for the mechanism section. In the following description, the frame 1 for the mechanism section will be referred to as the frame 1.

The frame 1 serves to hold the mechanism section 100 in a substantially sealing configuration, and furthermore, functions as a radiating path for radiating heat generated in the mechanism section 100 to the air.

The frame 1 preferably contains a high thermal conducting material such as a metal and a part thereof is configured to come in contact with the air. As a result of this arrangement, the heat generated in the mechanism section 100 is radiated to the air from a portion provided in contact with the air of the frame 1.

A thermal conductivity between the mechanism section 100 and the frame 1 is preferably as high as possible and is limited to have some value by a constraint such as an attachment.

The circuit section 200 is attached to the frame 2 for the circuit section. In the following description, the frame 2 for the circuit section will be referred to as the frame 2.

The circuit section 200 takes one of configurations of the control section for controlling the mechanism section 100.

The frame 2 serves to hold the circuit section 200 in a substantially sealing configuration, and furthermore, serves as a radiating path for radiating heat generated in the circuit section 200 to the air.

The frame 2 preferably contains a high thermal conducting material such as a metal and a part thereof is configured to come in contact with the air in the same manner as the frame 1. Herein, the heat generated in the mechanism section 200 is radiated to the air from a portion provided in contact with the air of the frame 2.

A thermal conductivity between the mechanism section 200 and the frame 2 is preferably as high as possible and is limited to have some value by a constraint such as an attachment.

In some cases, the frame 1 and/or the frame 2 are to be formed by a resin molding product or a combination of a metal and a resin depending on an equipment configuration and/or design. However, it is preferable that the frame 1 and/or the frame 2 should contain a material having a thermal conductivity which is as high as possible.

Moreover, it is preferable that the portion(s) of the frame 1 and/or the frame 2 coming in contact with the air should be subjected to such surface finishing as to increase the radiation rate of heat in order to increase radiation efficiency. More specifically, it is possible to increase the radiation rate of the heat by applying a black paint, forming a thin resin film having a black color or oxidizing a metal material itself (for example, black alumite processing) over that portion.

The frame 1 and the frame 2 are configured in such a manner that the frame 1 holds the mechanism section 100 in a substantially sealing configuration, and furthermore, the frame 2 holds the circuit section 200 in a substantially sealing configuration, thereby preventing the air in the frame 1 and that in the frame 2 from being convected.

A wiring section 3 electrically connects the mechanism section 100 to the circuit section 200. The wiring section 3 has such a sealing configuration that the air does not flow between the frame 1 and the frame 2.

The wiring section 3 includes a wiring member 31 formed by a flexible board. The wiring member 31 has a minimum pattern width and thickness in order to suppress a heat flow by heat conduction, and a line for transmitting a signal other than a specific signal is set to be as thin as possible or a constricted portion is provided in the middle of a wiring. The specific signal is a signal for a power and ground connection and/or a high speed signal, for example.

The frame 1 and the frame 2 are coupled to each other through a coupling section 4 including a low heat conducting material such as a resin. A heat insulating section 5 including a low heat conducting member such as a resin is provided in a portion in which the coupling section 4 is not provided between the frames 1 and 2.

By the configuration described above, heat generated in the mechanism section 100 and heat generated in the circuit section 200 are cut off through the coupling section 4 and the heat insulating section 5 and they are not transmitted mutually.

In the optical disk device 50, a rise in temperature of the mechanism section 100 is controlled and a rise in temperature around a semiconductor laser to be mounted on the mechanism section 100 is minimized to control a rise in the temperature of the semiconductor laser. For this reason, only necessary components for the recording and/or reproduction of the optical disk are disposed in the mechanism section 100 and the other components are disposed in the circuit section 200. Consequently, it is possible to reduce the consumed power of the mechanism section 100 to be smaller than that of the circuit section 200.

In a certain configuration, the consumed power of the mechanism section 100 can be set to be small, for example, approximately 0.5 W. In this case, the consumed power of the circuit section 200 is large, for example, approximately 1.5 W. The amount of heat generation is proportional to the consumed power. On the assumption that the volumes of the frame 1 and the frame 2 are set to be equal to each other, therefore, a temperature Tbe in the frame 2 is higher than a temperature Tbm in the frame 1.

On the assumption that the mechanism section and the circuit section are sealed into one frame as a general design, a temperature Tb in the frame has a relationship with the temperature Tbm in the frame 1 and the temperature Tbe in the frame 2 in the optical disk device 50:

$$Tbe > Tb > Tbm.$$

In detail, the optical disk device 50 has two frames (that is, the frame 1 and the frame 2), and the temperature Tbm in the frame 1 is lower than the temperature Tb in one assumed frame. In this case, the temperature Tbe in the frame 2 is higher than the temperature Tb in one assumed frame. Accordingly, it is necessary to set the upper limit of the operation guarantee temperature of the circuit component included in the circuit section 200 to be higher than the upper limit of the operation guarantee temperature of the mechanism section 100.

Referring to the circuit components, similarly, the operation guarantee temperature is varied depending on the amount of heat generation thereof. It can be assumed that there is a greater advantage that the reliability of the semiconductor laser is enhanced than an increase in the design load and cost load of the circuit section 200 when the setting is performed as described above.

As will be described below, moreover, the circuit section 200 has smaller restrictions on a mechanism basis than those in the mechanism section 100 and a dustproof performance is not required. In order to efficiently radiate heat, accordingly, it is possible to design the circuit section 200 comparatively freely. Therefore, the requirement to restrict the upper limit of the temperature range at which operation of the circuit component is assured does not need to be considered.

The radiating mechanism in the optical disk device 50 will be described below in more detail.

The heat generated in the mechanism section 100 is transmitted to the frame 1 to some degree. Moreover, the heat generated in the mechanism section 100 warms up the air in the vicinity of the mechanism section 100 and raises the temperature Tbm in the frame 1, and is transferred depending on a difference between the temperature Tbm in the frame 1 and a surface temperature Tsm in the frame 1. Temperature on the inside of the frame 1 is set to be equal to the temperature on the outside. The heat of the frame 1 is radiated to the air depending on the difference between the surface temperature Tsm of the frame 1 and an atmospheric temperature Ta.

The radiation is classified into three categories; a first category, in which the heat is transferred through a combination of conduction and radiation, a second category, in which heat is transferred through a combination of convection and radiation and a third category, in which heat is transferred through radiation alone.

On the assumption that the mechanism section 100 is insulatively attached to the frame 1, a difference (Tbm−Tsm) between the temperature in the frame 1 and the surface temperature of the frame 1 is equal to a difference (Tsm−Ta) between the surface temperature of the frame 1 and the atmospheric temperature. Since a part of the heat generated in the mechanism section 100 is actually transferred to the frame 1, the former difference is smaller. The temperature Tm of the mechanism section 100 is higher than the temperature Tbm in the frame 1, and the heat generated in the mechanism section 100 is radiated depending on a difference (Tm−Tbm) between the temperature Tm of the mechanism section 100 and the temperature Tbm in the frame 1.

Since the heat generated in the circuit section 200 is also radiated in the same manner as in the mechanism section 100, description will be omitted.

In FIG. 1, parts of the path through which heat is radiated and parts of the path through heat is convected are shown in a black arrow and a white arrow, respectively.

A relationship between the temperatures is shown in the following (1) to (3).

$$Tm>Tbm>Tsm>Ta \quad (1)$$

$$Te>Tbe>Tse>Ta \quad (2)$$

$$Tse>Tsm \quad (3)$$

(1) shows a relationship between the temperatures related to the mechanism section 100 and the frame 1, and Tm represents the temperature of the mechanism section 100, Tbm represents the temperature in the frame 1, Tsm represents the surface temperature of the frame 1, and Ta represents the atmospheric temperature.

(2) shows a relationship between the temperatures related to the circuit section 200 and the frame 2, and Te represents the temperature of the circuit section 200, Tbe represents the temperature in the frame 2, Tse represents the surface temperature of the frame 2, and Ta represents the atmospheric temperature.

(3) shows that the surface temperature Tsm of the frame 1 is lower than the surface temperature Tse of the frame 2 in the optical disk device 50.

It is possible to calculate a specific value of a rise in temperature by using an equation based on a model in which a component for generating heat at a specific consumed power is present in a frame disposed in the air. By using, as the same equation, the equation (not shown) described on Page 5, November 2002, "Electronic Technology", for example, it is possible to easily calculate the surface temperature of the frame and the temperature in the frame as values obtained by a constant heat flow and saturation. A result of the calculation is greatly coincident with a result of an experiment in which a simple small-sized frame is formed and a heating unit is held insulatively from an external frame.

According to the equation, the amount of a radiation based on convection is proportional to the surface area of the frame and is proportional to the difference between the temperature of the frame and the atmospheric temperature raised to the power of 1.25. Radiation efficiency is varied depending on the direction of the surface of the frame, that is, an upper, lower or transverse direction. Moreover, the amount of a radiation is proportional to the surface area of the frame and the radiation rate and is proportional to the difference between the temperature of the frame and the atmospheric temperature raised to the power of 1.25. The radiation is caused even if the air is not present, and the amount of the radiation is varied depending on a difference between the temperature of the frame and the temperature of the air or any other surrounding medium.

FIG. 2 is a table showing a specific result of the calculation for a rise in the temperature of the frame which is caused by the radiation.

In the table of FIG. 2, the result obtained by calculating the rise in the temperature in the frame is shown by using the equation described above on the assumption of a specific shape and a consumed power in the frame. In the following description, the frame will be referred to as a case.

It was assumed that the case is vertically disposed in such a manner that the mechanism section and the circuit section are provided on the left and right respectively. Moreover, it was assumed that the mechanism section is insulatively held in the case for the mechanism section and the circuit section is insulatively held in the case for the circuit section.

Each of the size of the case for the mechanism section and that of the case for the circuit section had a height of 60 mm, a depth of 60 mm and a width of 20 mm, and a volume of each case was set to be 72 cc.

Furthermore, portable equipment was assumed for the optical disk device, and the consumed power of the mechanism section was set to be 0.5 W and the consumed power of the circuit section was set to be 1.5 W. Although a value of the consumed power was to be reduced to a greater extent by the progress of the circuit technology in the future, the value described above was used as a standard. The atmospheric temperature was set to be 40° C. at which an operation guarantee is required by normal public equipment.

(A) to (G) in FIG. 2 are described as follows.

(A): When heat is not radiated from one broad opposing surface of the case for the mechanism section, (B): When the case which accommodates the mechanism section is opened, (C): When heat is not radiated from one broad opposing surface of the case for the circuit section, (D): When the case which accommodates the circuit section is opened, (E): When the cases are not separated from each other but the mechanism section and the circuit section are accommodated in one case, (F): When only the mechanism section is accommodated in one case, and (G): When only the circuit section is accommodated in one case.

As shown in (A) and (C), the temperature in the case for the mechanism section was raised by 12.5° C. and the temperature in the case for the circuit section was raised by 33.1° C.

On the other hand, in the case in which the mechanism section and the circuit section were accommodated in one case as shown in (E), the temperature in the case was raised by 23.1° C.

In other words, when a separation into two frames is performed as in the optical disk device 50, the rise in the temperature in the case for the mechanism section, that is, a rise in an ambient temperature of the semiconductor laser can be controlled by 10.6° C.

In (F), the case of (G) has an equal size to the size of the case of (E), and a rise in temperature in that case is shown for reference.

The results described above are obtained when a heat flow is not generated from the circuit section to the mechanism section. However, the heat flow is actually present. Therefore, a difference in temperatures is reduced. The case in which the heat flow is present will be taken into consideration.

It was assumed that a heat insulating section (corresponding to the heat insulating section 5 in FIG. 1) is provided between the mechanism section and the circuit section as a configuration which can be implemented specifically. A thermal conductivity of the heat insulating section was set to be approximately double that of air, that is, 0.04 W/m·m·K and a thickness of the heat insulating section was set to be 5 mm. It was assumed that the heat flow generated by the wiring section and the coupling section is also included in the heat insulating section.

A thermal resistance generated by the heat insulating section is 34.7° C./W. Thermal resistances of the mechanism section and the circuit section were simply calculated from the value of FIG. 2 and were set to be 22.0° C./W and 25.0° C./W respectively so that an equation for the thermal resistance was solved. As a result, in a state of saturation, a power (heat) of 0.18 W was transferred from the circuit section to the mechanism section and a rise in the temperature of the case of the circuit section was reduced by 4.0° C. to be 29.1° C., and in contrast, temperature in the mechanism section was raised by 4.4° C. to be 16.9° C. so that the effect of controlling a rise in temperature was that the temperature was reduced to 6.2° C.

However, the two cases are mutually insulated, thereby suppressing the transfer of the heat. Therefore, it is possible to effectively control the rise in the temperature of the semiconductor laser.

The temperature in the case for the mechanism section is obtained by adding an atmospheric temperature of 40° C. to the rise in the temperature in the case for the mechanism section. Therefore, an ambient temperature of the semiconductor laser of 56.9° C. (=40° C.+16.9° C.) is obtained.

The temperature of the semiconductor laser is further raised by a self heat generation. For this reason, it is hard to use a semiconductor laser in which an upper limit of an operation guarantee temperature is 60° C., for example. In the design of an actual device, therefore, a radiation from an optical head mounting the semiconductor laser thereon is improved or the radiation of the mechanism section is enhanced. In this case, a thermal conductivity from the optical head and the mechanism section to the frame for the mechanism section is increased to transfer heat to the frame through a path other than the air in the frame. Consequently, the rise in temperature of the frame can be controlled. Thus, it is possible to suppress a rise in the temperature of the semiconductor laser itself.

In order to improve the radiation, moreover, it is also possible to increase a size of the frame, to enhance a heat insulating effect between multiple frames, to reduce a consumed power and to improve the radiation of the circuit section to suppress a rise in temperature, thereby reducing a heat flow, to attach an opening having a dustproof filter to the mechanism section to maintain a dust-resistance, and at the same time, to lower the temperature in the frame by ventilation in order to reduce an operating temperature of the semiconductor laser.

Furthermore, it is also required to perform a design in order to guarantee an operation of the optical disk device at a general atmospheric temperature, for example, to use a semiconductor laser having a high guarantee operation temperature, that is, 70° C.

In any case, the frames 1 and 2 are mutually insulated as in the optical disk device 50. Consequently, a rise in the operating temperature of the semiconductor laser can be controlled to a greater extent than that in a conventional mechanism.

Also in the case in which the heat insulating section 5 is not provided between the frames 1 and 2, the frames 1 and 2 are disposed apart from each other by a predetermined distance and an air layer is thus provided. Consequently, the air layer plays the same part as the heat insulating section.

In the case in which the air layer is provided, a thermal transfer is generated by all of heat conduction, convection and a radiation of a thermal transfer mechanism. In detail, heat of a member having a high temperature is transferred to a member having a low temperature by heat conduction corresponding to a thermal conductivity of the air, a convection of the air layer and a radiation from the frame.

In the case in which the heat insulating section 5 is not provided between the frames 1 and 2, it is desirable to perform such surface finishing as to reduce a radiation rate of heat in such a manner that a thermal transfer is not generated by a radiation in at least one of the opposed surfaces of the frames 1 and 2.

For such surface finishing that the radiation rate of the heat is reduced, a metal material of the frame is subjected to a mirror treatment or a thin aluminum foil is applied, for example. Furthermore, heat can be radiated efficiently if the air flows through the air layer.

In the case in which the radiation rate of the frame cannot be reduced or the case in which the air cannot flow through a surface of the frame, it is also preferable that the heat insulating section 5 should be provided. If the heat insulating section 5 is provided, heat is transferred by heat conduction and heat transfer generated by convection and a radiation is suppressed. By selecting, for the heat insulating section 5, a resin material having a thermal conductivity which is almost equal to that of the air or the like, it is possible to considerably reduce an amount of the thermal transfer.

Figure 3:
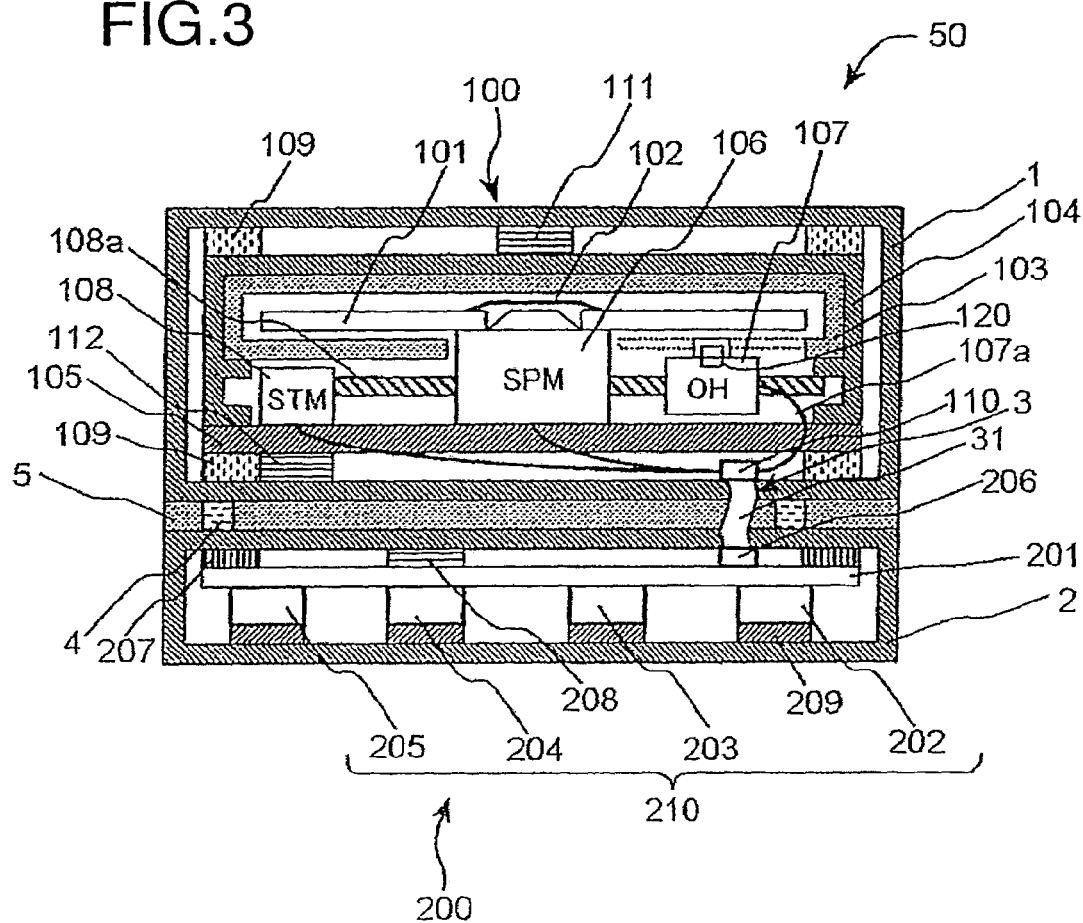
FIG. 3 is a schematically sectional-view, more specifically showing a mechanism section and a circuit section in the optical disk device according to the first embodiment of the present invention.

FIG. 3 is a schematically sectional-view, more specifically showing the mechanism section 100 and the circuit section 200 in the optical disk device 50 according to a first embodiment of the present invention.

FIG. 3 shows an arrangement of each component of the optical disk device 50 clearly. In particular, FIG. 3 shows what kinds of components belong to the mechanism section 100 and the circuit section 200. A relationship and operation of each component is well-known and detailed description which is not related to the present invention will be omitted.

In the optical disk device 50 shown in FIG. 3, members having the same reference numerals as those in FIG. 1 have the same functions, and therefore, description thereof will be omitted.

In order to cause the frame 2 to directly radiate heat generated in an IC section 210, the frame 2 has such a configuration that a size thereof is smaller than that of the frame 1.

The mechanism section 100 includes an optical head 107, a spindle motor 106 and a stepping motor 108.

An optical disk 101 is mounted on a mechanism section 100. A frame 1 holds the mechanism section 100 in a substantially sealing configuration and has such a configuration that the optical disk 101 can be mounted from an outside and can be taken out to the outside.

The optical disk 101 attached to a clamping plate 102 is accommodated in a cartridge 103. The cartridge 103 is held by a cartridge holder 104 and is positioned with respect to a traverse base 105. On the other hand, the clamping plate 102 is attracted to a magnet of a turntable on a spindle motor 106. Consequently, the optical disk 101 is centered and held.

An optical head 107 performs at least one of recording and reproduction with respect to the optical disk 101 which is mounted. A semiconductor laser 120, an optoelectronic integrated circuit (OEIC) (not shown) and the like are mounted on the optical head 107.

The optical head 107 is moved by means of a screw shaft 108a of a stepping motor 108 provided on the traverse base 105.

The optical head 107 and a relay connector 110 are connected through a flexible board 107a. Moreover, the spindle motor 106 and the stepping motor 108 are also connected to the relay connector 110 through a wiring member (for example, a flexible board). The mechanism section 100 and the circuit section 200 are connected through a wiring section 3 in which a wiring member 31 is collected in order to lessen thermal coupling as greatly as possible.

A damper 109 is disposed on four corners of the inner part of the frame 1.

A radiating member 111 connects the cartridge holder 104 to the frame 1, and heat of the cartridge holder 104 is transferred to the frame 1 through the radiating member 111.

A radiating member 112 connects the traverse base 105 to the frame 1 and heat of the traverse base 105 is transferred to the frame 1 through the radiating member 112.

The damper 109 generally contains a material having a comparatively low thermal conductivity such as a rubber or a rubber-like resin, while the radiating member 111 and the radiating member 112 function to efficiently transfer the heat of each of the cartridge holder 104 and the traverse base 105 to the frame 1, and the radiating member 111 and the radiating member 112 include a flexible board or a metal spring, for example, as a material for transferring heat while maintaining the effect of the damper 109.

Next, the circuit section 200 will be described.

The circuit section 200 includes a circuit board 201 and an IC section 210 disposed on the circuit board 201.

The IC section 210 includes a laser driving IC 202 for driving the semiconductor laser 120, a PWM driving IC 203 for efficiently driving, on a power basis, the spindle motor 106, the stepping motor 108 and an actuator for focus and an actuator for tracking which are provided on the optical head 101, an analog signal processing IC 204 for processing a signal of the optical head 107 in recording and reproduction, and a digital signal processing IC 205 for processing a signal of the optical head 107 in the recording and reproduction.

In the optical disk device 50, particularly, the laser driving IC 202 having a high performance which is generally mounted on the optical head 107 is disposed in the circuit section 200 and the consumed power of the mechanism section 100 is reduced. The laser driving IC 202 is disposed to approach the mechanism section 100 as greatly as possible. Consequently, a reduction in the performance of the laser driving IC 202 is minimized.

Furthermore, a relay connector 206 is disposed on the circuit board 201 and is connected to the mechanism section 100 through a wiring member 31.

A circuit board 201 is fixed to a frame 2 by means of a coupling section 207. A radiating section 208 connects the circuit board 201 to the frame 2 and heat of the circuit board 201 is transferred to the frame 2 through the radiating section 208.

It is preferable that both the coupling section 207 and the radiating section 208 should contain metallic materials having high thermal conductivities and a radiation efficiency should be increased by a contact with a portion having a low heat resistance such as a whole ground of the circuit board 201 or the like.

The radiating sheet 209 connects the IC section 210 to the frame 2 and contains a material having a high thermal conductivity. Heat generated in the IC section 210 is transmitted to the frame 2 through the radiating sheet 209.

A basic radiating mechanism for the optical disk device 50 is the same as that described with reference to FIG. 1. A radiating path is particularly complicated in the frames 1 and 2 and classification into convection, radiation and heat conduction is hard to perform as microscopic analysis cannot be performed. However, it is observed by microscopic analysis, that in the mechanism section, heat generated in the optical head 107 is transferred by a convection current of the air in the frame 1 and a radiation into the air in the frame 1 and other components, and heat conduction to the traverse base 105 through the screw shaft 108a.

On the other hand, heat generated in each of the spindle motor 106 and the stepping motor 108 is stored in the traverse base 105 in addition to the heat generated in the optical head 107 so that the temperature of the traverse base 105 is raised. The heat of the traverse base 105 is transferred to the frame 1 through the air in the frame 1, the damper 109, the radiating member 111 and the radiating member 112.

Referring to the radiation of the heat of the circuit section 200, heat conduction to the frame 2 is predominant over the convection of the air in the frame 2 and the radiation.

While the thermal conductivity between the circuit section 200 and the frame 2 is limited in the description performed with reference to FIG. 1, the temperature of the frame 2 is almost equal to that of the circuit section 200 and the generated heat flows by rarely using the air in the frame 2 when a thermal conductivity is sufficiently increased by the configuration described above. Moreover, the temperature in the frame 2 is also raised by the circuit section 200 and the frame 2 and becomes almost equal.

On the other hand, a difference between the temperature of the frame 2 and the atmospheric temperature in a saturation state in which the amount of heat generation is equal to that of a radiation is equal to a difference between the temperature of the frame 2 and the atmospheric temperature in the case in which the heat is radiated through the air in the frame 2. As a result, a rise in the temperature in the frame 2 is a half of that obtained when the frame 2 insulatively holds the circuit section 200. Therefore, the requirement to restrict the temperature range at which operation of the circuit component in the circuit section 200 is relieved.

This can also be utilized in an improvement in the radiation of the heat in the mechanism section 100. For example, by connecting the mechanism section 100 to the frame 1 using a heat conductor to rapidly improve the thermal conductivity of the mechanism section 100 without utilizing the damper 109 as another method for improving heat conduction between the mechanism section 100 and the frame 1 with the configuration described above, consequently, it is possible to suppress a rise in the temperature in the frame 1.

As described above with reference to FIG. 3, with the configuration of the optical disk device 50, it is possible to suppress a rise in the temperature in the frame 1 holding the mechanism section 100 to a greater extend than that in the case in which the mechanism section and the circuit section are provided in one frame. Consequently, the optical disk device 50 can suppress a rise in the temperature of the semiconductor laser.

In the case in which the opposed surfaces of the frames 1 and 2 cannot be perfectly flat in respect of the configuration, the shapes may be changed optionally. Moreover, a gap may be provided in a part of the opposed surfaces in such a manner that the amount of heat transferred from the circuit section to the mechanism section is lessened depending on a whole size, a balance of a consumed power or a radiating mechanism of the circuit section.

While the wiring member 31 is a flexible board, it is also possible to use a connector of a stack type which has a low thermal conductivity, that is, a high thermal resistance in order to improve workability.

In the case in which the heat insulating section 5 is provided between the frames 1 and 2, the portion of the frame 1 or the frame 2 which contacts the heat insulating section 5 does not need to be completely sealed. The portion of the frame 1 or the frame 2 may be provided with a hole in order to reduce the weight thereof within such a range that a thermal conductivity is not significantly damaged.

In addition, a repetitive emphasis will be given. While the metallic frame having a high thermal conductivity has been used for the frames 1 and 2 in the above description, it is also possible to use a frame formed of a resin combined with a metal or formed wholly of a resin due to a cost, a designing property and the like. Also in that case, it is possible to suppress a rise in the temperature of the semiconductor laser with a simple configuration by causing the frame 1 to radiate the heat generated in the mechanism section 100 and the frame 2 to radiate the heat generated in the circuit section 200 to be insulated from each other. As a matter of course, it is apparent that the frame is preferably a member having a high thermal conductivity and radiation capability even if it is formed of a resin.

Second Embodiment

Figure 4:
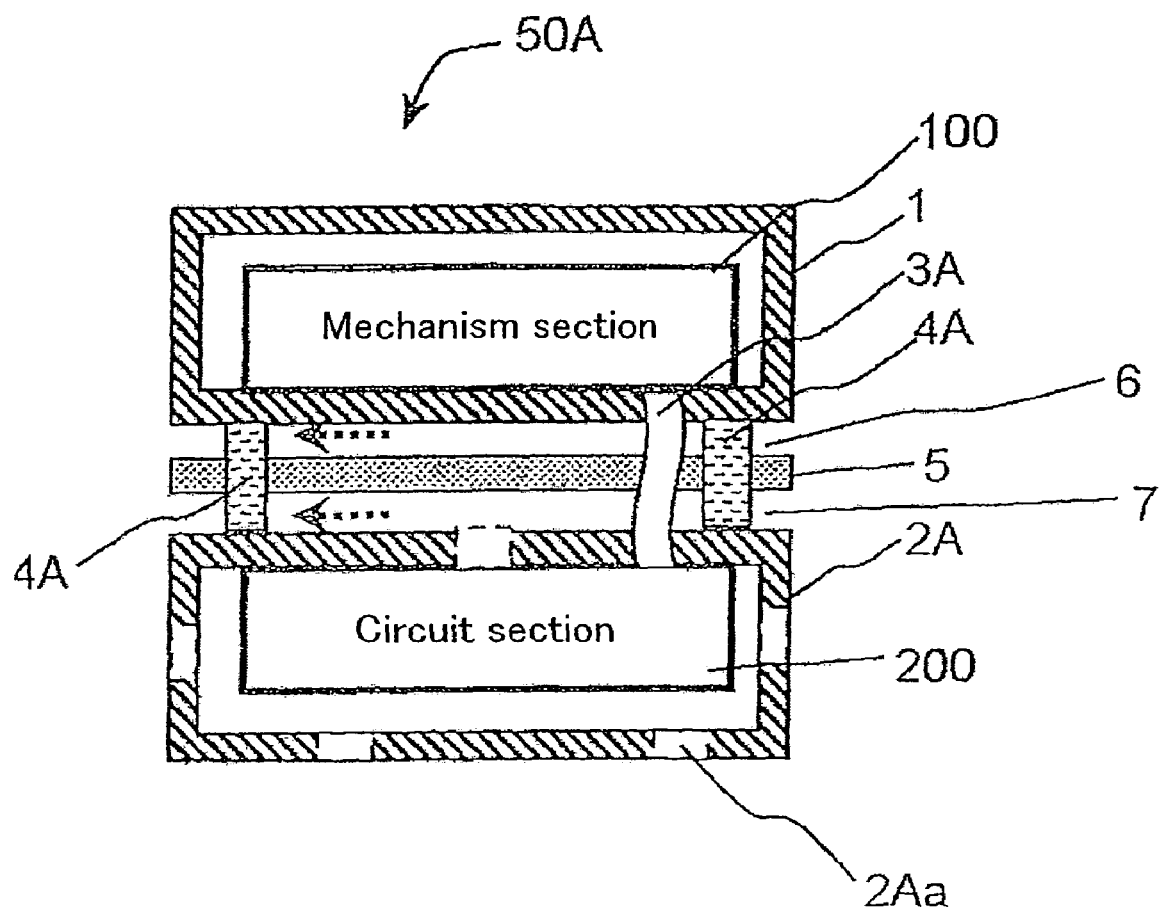
FIG. 4 is a sectional-view schematically showing an optical disk device according to a second embodiment of the present invention.

FIG. 4 is a sectional-view schematically showing an optical disk device 50A according to a second embodiment of the present invention.

In the optical disk device 50A, the same members as those in the optical disk device 50 described with reference to FIG. 1 in the first embodiment have the same reference numerals and their description will be omitted.

Moreover, alphabets are attached to the last of the reference numerals for the members having configurations changed in order to make a distinction.

The optical disk device 50A is different from the optical disk device 50 described with reference to FIG. 1 in the following two respects. Similarly, a frame 1 for a mechanism section will be referred to as a frame 1 and a frame 2A for a circuit section will be referred to as a frame 2A.

A first difference is that the frame 2A is provided with a hole 2Aa capable of performing ventilation. The inner part of the frame 2A is ventilated through the hole 2Aa to increase the amount of the radiation of a circuit section 200, thereby suppressing a rise in the temperature of the circuit section 200. Since the circuit section 200 can be prevented from being deteriorated in a performance due to a dust differently from the mechanism section 100, the opening 2Aa may be provided.

Another difference is that a wiring section 3A and a coupling section 4A are set to be long and a distance between the frames 1 and 2 is increased. Thus, the wiring section 3A and the coupling section 4 are set to be long without changing the length of a heat insulating section 5. Consequently, a gap 6 is provided between the frame 1 and the heat insulating section 5 and a gap 7 is provided between the frame 2 and the heat insulating section 5. Consequently, the air can pass through the gaps 6 and 7 so that the frame 1, the frame 2 and the heat insulating section 5 are cooled and radiation efficiency is thus increased.

With such a configuration, the size of the optical disk 50A is slightly larger and a heat flow to be transmitted from the circuit section 200 to the mechanism section 100 is decreased. Consequently, a rise in the temperature of the mechanism section 100 can be suppressed to a greater extent than that in the optical disk device 50 described in the first embodiment. Thus, the operating temperature of a semiconductor laser can be reduced to a greater extent.

In the case in which the air can be caused to sufficiently pass through the gaps 6 and 7, it is possible to increase a cooling efficiency to a greater extent by increasing the radiation rates of the surfaces of the frames 1 and 2 facing the heating insulating section 5, thereby increasing the amount of a radiation or providing concavo-convex portions over the surfaces to increase the amount of a radiation through a convection.

While two gaps (that is, the gaps 6 and 7) are provided in the optical disk device 50B, the present embodiment is not restricted thereto. One gap may be provided in the optical disk device 50B.

Third Embodiment

Figure 5:
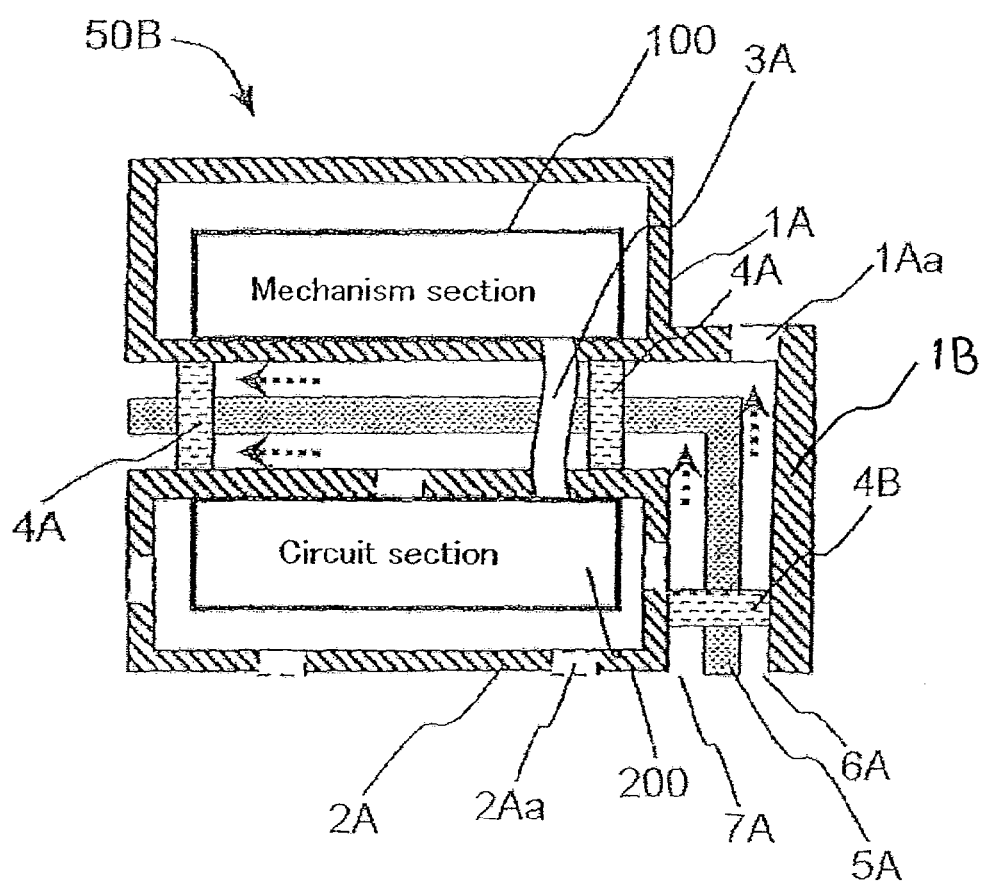
FIG. 5 is a sectional-view schematically showing an optical disk device according to a third embodiment of the present invention.

FIG. 5 is a sectional-view schematically showing an optical disk device 50B according to a third embodiment of the present invention.

In the optical disk device 50B, particularly, it is assumed that a frame can be designed comparatively freely so as to be connected to USB or IEEE1394 as peripheral equipment of personal computer (PC). As a matter of course, it is also possible to apply the optical disk device 50B to an optical disk video camera.

In the optical disk device 50B, the same members as those of the optical disk device 50 described in the first embodiment and the optical disk device 50A described in the second embodiment have the same reference numerals and the description of the members will be omitted.

Moreover, alphabetical letters are attached to the last of the reference numerals for the members having configurations changed in order to make a distinction.

The optical disk device 50B is greatly different from the optical disk device 50 described in the first embodiment and the optical disk device 50A described in the second embodiment in that a frame 1A for a mechanism section greatly covers a frame 2A for a circuit section.

Similarly, the frame 1A for a mechanism section will be referred to as a frame 1A and the frame 2A for a circuit section will be referred to as a frame 2A.

In the optical disk device 50B, a portion of the frame 1A which comes in contact with the air covers the frame 2A, thereby increasing the radiation area of the frame 1A to be larger than that of each of the optical disk device 50 described in the first embodiment and the optical disk device 50A described in the second embodiment. Thus, the radiation efficiency of the mechanism section 100 is increased.

In the optical disk device 50B, moreover, the heat insulating section 5A is also enlarged corresponding to the enlargement of the frame 1A, and a gap 6A provided between the frame 1A and the heat insulating section 5A and a gap 7A provided between the frame 2A and the heat insulating section 5A are also enlarged corresponding to the enlargement of the heat insulating section 5A.

As a member for coupling the frame 1A to the frame 1B corresponding to the enlargement of the frame 1A, moreover, a coupling section 4B is provided in addition to a coupling section 4A.

The frame 1A is also provided with a hole 1Aa in order to improve the circulation of the gap 6A and the air.

With the enlargement of the frame 1A, thus, the amount of a radiation of a circuit section 200 is slightly sacrificed. However, the amount of the radiation of the mechanism section 100 is increased. Consequently, it is possible to suppress a rise in the temperature of a semiconductor laser.

A portion of the frame 1A which covers the frame 2A may be assembled as another piece for convenience of processing and assembly in the manufacture of the optical disk device 50B.

In the case in which a power line is supplied to the optical disk device 50B separately from a signal line in an interface of a PC or the like or the case in which a power is supplied through an AC line or an AC adaptor, it is not necessary to care about the duration of a battery. Therefore, ventilation may be forcibly performed by means of a small-sized fan from the gaps 6A and 7A.

In this case, it is preferable that the fan should be driven when it is decided that a power is not the battery. In the case in which a temperature sensor or the like is provided in the optical disk device 50B and temperature detected by the temperature sensor is set to be equal to or higher than a predetermined temperature, it is preferable that the fan should be rotated.

Fourth Embodiment

Figure 6:
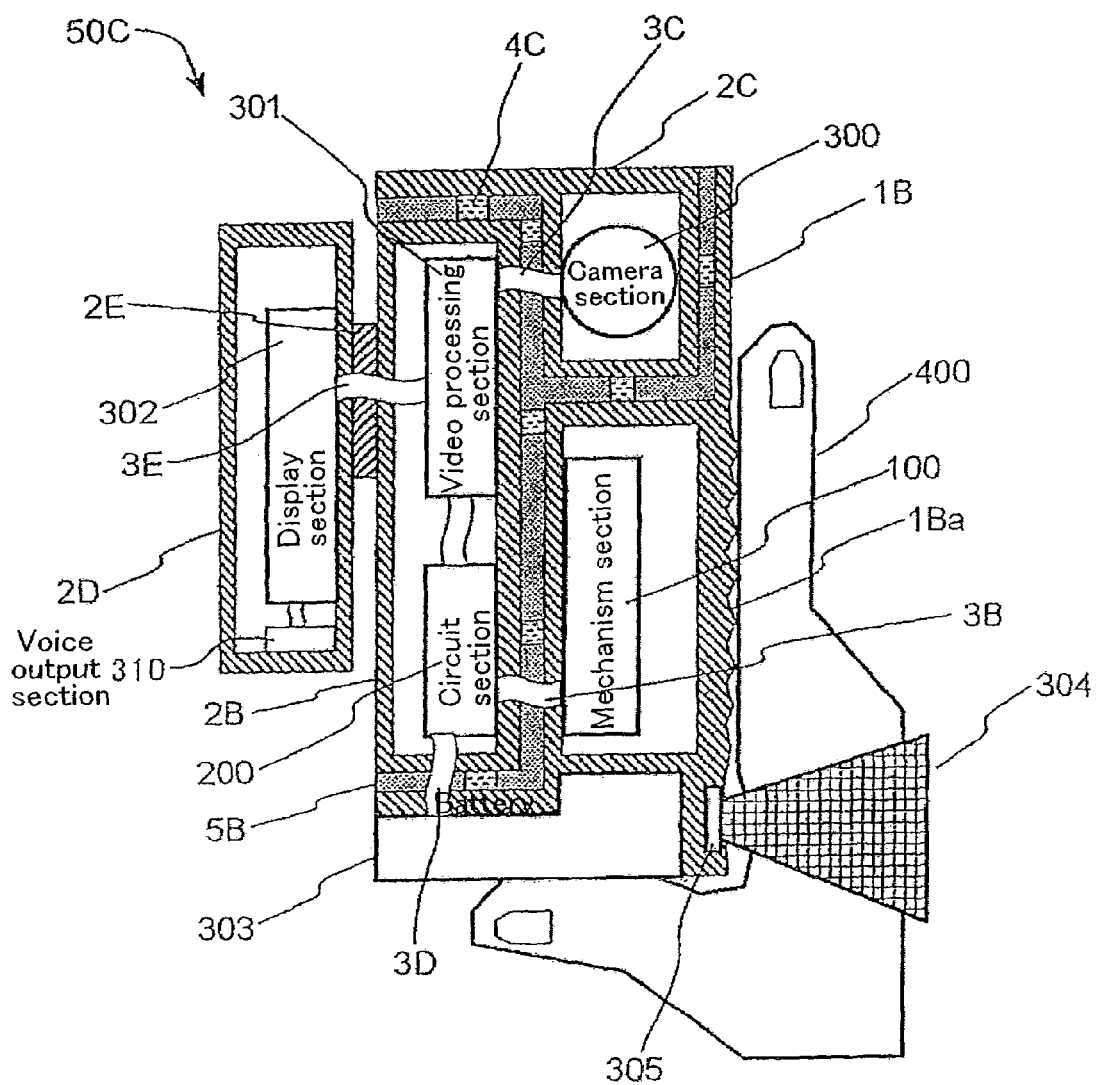
FIG. 6 is a sectional-view schematically showing an optical disk device according to a fourth embodiment of the present invention.

FIG. 6 is a sectional-view schematically showing an optical disk device 50C according to a fourth embodiment of the present invention.

The optical disk device 50C has a video camera function.

In the optical disk device 50C, members having the same functions as those of the optical disk devices 50, 50A and 50B described in the first to third embodiments have the same reference numerals and the description of the members will be omitted.

While the optical disk device 50C having the video camera function is also referred to as an optical disk video camera, it will be referred to as a video camera 50C in the following description.

Moreover, alphabetical letters are attached to the last of the reference numerals for the members having configurations changed in order to make a distinction.

A belt 304 for holding the video camera 50C and a human hand 400 are not shown in a sectional view.

The video camera 50C includes a mechanism section 100, a circuit section 200, a camera section 300, a video processing section 301, and a display section 302. The display section 302 is an LCD panel, for example.

In the video camera 50C, a frame 1B for the mechanism section sets the whole right and lower surfaces of the video camera to be radiating surfaces. Similarly, the frame 1B for the mechanism section will be referred to as a frame 1B.

The camera section 300 includes a solid-state imaging unit such as a CCD (not shown), an imaging section such as a zoom lens optical system, and a voice input circuit such as a microphone.

The camera section 300 is controlled by the video processing section 301 connected through a wiring section 3C.

The video processing section 301 displays, on the display section 302, a video indicated by a video signal obtained by the camera section 300 and outputs, from a voice output section 310, a voice indicated by a voice signal obtained by the camera section 300.

Moreover, the video processing section 301 compresses the video signal and the voice signal which are obtained by the camera section 300 to generate compression data, and transmits the compression data to the circuit section 200 and records the compression data as video information and voice information in the optical disk of the mechanism section 100.

In the same manner as in an ordinary video camera, the display section 302 is configured to be opened and seen like a book from a camera body. In the case in which a user does not use the display section 302 after closing, switching to the display of a view finder (not shown) is performed.

In a reproduction, the video processing section 301 reproduces the compression data as video information and voice information from the optical disk of the mechanism section 100 so that the compression data is expanded in the video processing section 301 and is restored to the video signal and the voice signal. The voice processing section 301 outputs the restored video signal and voice signal to the display section 302 and the voice output section 310, respectively.

The video signal and the voice signal which are expanded may be output through an analog terminal to the outside of the video camera 50C and the compression data may be exactly output as a digital signal to an AV server, a PC and the like.

The video processing section 301 and the circuit section 200 are held in a frame 2B for the circuit section, the camera section 300 is held in a frame 2C for the camera section, and the display section 302 and the voice output section 310 are held in a frame 2D for the display section. In the following description, the frame 2B for the circuit section, the frame 2C for the camera section and the frame 2D for the display section will be referred to as a frame 2B, a frame 2C and a frame 2D, respectively.

In order to prevent deterioration in an SN ratio caused by the temperature characteristic of an imaging unit in the camera section 300, the frame 2C for holding the camera section 300 is insulated from the other frames 1B and 2B.

Moreover, the frames 2B and 2D are coupled to each other through a circuit coupling frame 2E having a high thermal conductivity, and heat generated in each of the circuit section 200, the video processing section 301 and the display section 302 is radiated from the frames 2B and 2D.

In a general using state, the frames 2B and 2D are opened. Consequently, radiation efficiency is increased.

When the frames 2B and 2D are closed, the display of the display section 302 is stopped and the display section of a view finder (not shown) performs the display.

The frames 1B, 2B and 2C are coupled to each other through a coupling section 4C, and a heat insulating section 5B is provided among the frames 1B, 2B and 2C in order to minimize thermal coupling, respectively.

The mechanism section 100 and the circuit section 200 are electrically connected to each other through a wiring section 3B. The camera section 300 and the video processing section 301 are electrically connected to each other through a wiring section 3C. The circuit section 200 and a battery 303 are electrically connected to each other through a wiring section 3D The video processing section 301 and the display section 302 are electrically connected to each other through a wiring section 3E.

The battery 303 is further attached to the frame 1B. Consequently, the radiation area of the frame 1B is increased, and furthermore, a time required for reaching a thermal saturation can be prolonged by utilizing the comparatively large heat capacity of the battery 303 itself. In case of a battery having an ordinary size, it is possible to prolong a saturation time by 30 minutes or more as an approximate estimate. The battery 303 is a component in which heat is slightly generated by an internal resistance and temperature is not basically raised greatly.

In ordinary photographing, a time required for the photographing is several minutes to several tens of minutes. Therefore, a photographing operation is ended before a rise in the temperature of the mechanism section 100 reaches a saturation level. Accordingly, the rise in the temperature can be reduced to be lower than a high temperature in the saturation. It is assumed that the operation of the video camera 50C is stopped in a photographing stop state or a reproduction stop state.

The belt 304 fabricated with a material having a comparatively high thermal conductivity is attached to the frame 1B through a belt attaching section 305. By fabricating the belt with a material having a comparatively high thermal conductivity, thus, it is possible to increase radiation efficiency.

By employing a configuration in which the frame 1B is held by the human hand 400, furthermore, it is possible to radiate, through the human hand 400, heat stored in the frame 1B before using the video camera 50C or heat generated in the mechanism section 100 during the use of the video camera 50C. In the case in which the temperature of the video camera 50C is lower than a human temperature, the video camera 50C receives the heat from the human hand 400 so that temperature is raised to 36 to 37° C.

The frame 1B is provided with a concavo-convex portion 1Ba in order to reduce a contact area with the human hand 400, there by preventing user discomfort. In the case in which the upper limit of the operation guarantee temperature of the video camera 50C is equal to or higher than the body temperature of a human (for example, 40° C.), the radiation of the heat through the human hand is effective. This effect cannot be expected in the case in which a tripod or the like is used so as not to touch the human hand. For this reason, the frame 1B is set to be insulated from the other frames 2B and 2C.

As described above, referring to the optical disk device 50C having the video camera function, there is provided a video camera having a high reliability and a long lifetime in which the frame 1B for holding the mechanism section 100 including a semiconductor laser is caused to be insulated from the other frames 2B and 2C, thereby suppressing a rise in the temperature of the semiconductor laser.

It is desirable that the actual video camera 50C should be designed to be compact for the human hand 400 and should be easy to grip, and should be designed to have a small size. In order to reduce the height of the video camera 50C in such a manner that the video camera 50C can be gripped by the human hand 400, moreover, the camera section 300 may be disposed on the left of the mechanism section 100.

By reducing the radiation rate of a surface on which a sunlight is irradiated during the use of the video camera 50C and providing the concavo-convex portion 1Ba on the surface of the video camera 50C to perform surface finishing in order to increase the radiation rate of a surface on which the sunlight is irradiated with difficulty, moreover, it is possible to improve the radiation of the video camera 50C by the radiation while suppressing a rise in temperature through the heat absorption of the sunlight.

While the four embodiments have been described above, the present invention is not restricted to only the embodiments described above but includes all embodiments producing the same effects. Furthermore, the functions of the semiconductor laser device according to the present invention are restricted to neither the function of the optical disk device nor the function of the video camera. The functions of the semiconductor laser device may include all application functions for using the optical disk device as a storage device, for example, a digital still camera or the like.

Moreover, the present invention can also be applied to a DVD-RAM device for a so-called built-in PC and the like. For example, only the frame for the mechanism section may be designed to be attached to a PC housing but another frame for the circuit section may not be attached to the PC housing but may be forcibly cooled by air through a fan in the PC housing or the like. Furthermore, it is also possible to attach the frame for the circuit section to the PC housing and to break heat conduction between another frame for the mechanism section and the PC housing, thereby forcibly performing the air cooling through the fan. In this case, it is reasonable to measure any of which can suppress the rise in the temperature of the semiconductor laser in the mechanism section, thereby determining an attaching method. For this reason, it is preferable to employ a configuration in which the temperature of the semiconductor laser can be measured by means of a temperature sensor or the like and can be checked on the outside of the PC. By attaching the temperature sensor for measuring the temperature of the semiconductor laser to a single optical disk device or an optical disk video camera to easily determine the temperature, moreover, it is possible to efficiently confirm the effect of the radiating mechanism.

As described above, the present invention is exemplified by the use of the preferred embodiments of the present invention. However, the present invention should not be interpreted solely based on the embodiments described above. It is understood that the scope of the present invention should be interpreted solely based on the claims. It is also understood that those skilled in the art can implement equivalent scope of technology, based on the description of the present invention and common knowledge from the description of the detailed preferred embodiments of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, a frame for radiating heat generated in a mechanism section including a semi conductor laser and a frame for radiating heat generated in a control section for controlling the mechanism section are insulatively coupled to each other. Therefore, it is possible to minimize a rise in an ambient temperature of the semiconductor laser. As a result, it is possible to reduce the operating temperature of the semiconductor laser. Consequently, it is possible to considerably improve a lifetime to be determined by the operating reliability and operating temperature of the semiconductor laser.

Moreover, the same configuration is applied to a semiconductor laser device having a video camera function. Consequently, it is possible to provide a semiconductor laser device having a high reliability in which a rise in an operating temperature of the semiconductor laser is suppressed also in a high temperature environment and an operation range is wide.

The invention claimed is:

1. A semiconductor laser device comprising:
   a mechanism section including a semiconductor laser;
   a first frame for holding the mechanism section and radiating heat generated in the mechanism section;
   a control section for controlling the mechanism section;
   a second frame for holding the control section and radiating heat generated in the control section; and
   a coupling section having a low thermal conductivity, for insulatively coupling the first frame to the second frame.

2. A semiconductor laser device according to claim 1, further comprising a wiring section for electrically connecting the mechanism section to the control section.

3. A semiconductor laser device according to claim 1, wherein the first frame has a portion coming in contact with air and heat generated in the mechanism section is radiated through the portion.

4. A semiconductor laser device according to claim 1, wherein the second frame has a portion coming in contact with air and heat generated in the control section is radiated through the portion.

5. A semiconductor laser device according to claim 1, wherein the mechanism section includes an optical head for performing at least one of recording and reproduction for an optical disk, and the optical head includes the semiconductor laser.

6. A semiconductor laser device according to claim 1, wherein the first frame and the second frame are configured to prevent air in the first frame and air in the second frame from being convected.

7. A semiconductor laser device according to claim 1, wherein at least one of the first frame and the second frame contains a material having a high thermal conductivity.

8. A semiconductor laser device according to claim 1, wherein at least a part of a portion is subjected to surface finishing having a low radiation efficiency, the portion at which the first frame and the second frame facing each other.

9. A semiconductor laser device according to claim 1, wherein the first frame has a first portion coming in contact with air,
   the second frame has a second portion coming in contact with the air, and
   at least one of the first portion and the second portion is subjected to surface finishing having a high radiation efficiency.

10. A semiconductor laser device according to claim 2, wherein the wiring section is sealed to prevent air in the first frame and the air in the second frame from being circulated mutually.

11. A semiconductor laser device according to claim 1, wherein the first frame has a portion coming in contact with air, and
    the portion is configured to cover a part of the second frame.

12. A semiconductor laser device according to claim 1, wherein the first frame and the second frame are disposed to provide a gap to allow air to circulate between the first frame and the second frame.

13. A semiconductor laser device according to claim 1, wherein the coupling section contains a material having a low thermal conductivity.

14. A semiconductor laser device according to claim 1, further comprising a heat insulating section disposed between the first frame and the second frame and formed with a material having a low thermal conductivity.

15. A semiconductor laser device according to claim 14, wherein a gap is configured between at least one of the heat insulating section and the first frame and the heat insulating section and the second frame, and the gap is present allow air to circulate.

16. A semiconductor laser device according to claim 1, wherein the first frame has a first portion coming in contact with air,
    the second frame has a second portion coming in contact with the air, and
    at least one of the first portion and the second portion is provided with a concavo-convex portion.

17. A semiconductor laser device according to claim 5, further comprising:
    a camera section;
    a display section for displaying a video indicated by a video signal obtained by the camera section; and
    a video processing circuit for compressing the video signal and recording the compressed video signal as video information on the optical disk by using the optical head or reproducing the video information recorded on the optical disk by using the optical head, thereby expanding the video information thus reproduced and causing the display section to display the video information thus expanded.

* * * * *

UNITED STATES PATENT AND TRADEMARK OFFICE
CERTIFICATE OF CORRECTION

PATENT NO. : 7,397,830 B2  
APPLICATION NO. : 10/555940  
DATED : July 8, 2008  
INVENTOR(S) : Ishibashi et al.

Page 1 of 1

It is certified that error appears in the above-identified patent and that said Letters Patent is hereby corrected as shown below:

On the Cover Page, item [30], Foreign Application Priority Data:
should read --May 8, 2003 (JP) 2003-130104--

Signed and Sealed this

Fourth Day of November, 2008

JON W. DUDAS  
*Director of the United States Patent and Trademark Office*